US012793786B2

(12) United States Patent
Lim et al.

(10) Patent No.: US 12,793,786 B2
(45) Date of Patent: Nov. 10, 2026

(54) STORAGE DEVICE AND STORAGE SYSTEM INCLUDING THE SAME

(71) Applicant: Samsung Electronics Co., Ltd., Suwon-si (KR)

(72) Inventors: Suhwan Lim, Suwon-si (KR); Kyunghwan Lee, Suwon-si (KR); Yongseok Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 127 days.

(21) Appl. No.: 18/510,074

(22) Filed: Nov. 15, 2023

(65) Prior Publication Data

US 2024/0170072 A1 May 23, 2024

(30) Foreign Application Priority Data

Nov. 18, 2022 (KR) ........................ 10-2022-0155803

(51) Int. Cl.
*G11C 16/16* (2006.01)
*G11C 16/04* (2006.01)
(Continued)

(52) U.S. Cl.
CPC .......... *G11C 16/16* (2013.01); *G11C 16/0433* (2013.01); *G11C 16/24* (2013.01); *G11C 16/32* (2013.01)

(58) Field of Classification Search
CPC ..... G11C 16/16; G11C 16/0433; G11C 16/24; G11C 16/32
(Continued)

(56) References Cited

U.S. PATENT DOCUMENTS 9,324,440 B2 4/2016 Park et al.
9,711,229 B1 * 7/2017 Rabkin ................. H10B 43/10
(Continued)

FOREIGN PATENT DOCUMENTS

KR 10-2022-0090210 A 6/2022
KR 10-2023-0017950 A 2/2023

OTHER PUBLICATIONS

Yoo et al., "First Demonstration of 1-bit Erase in Vertical NAND Flash Memory," 2022 Symposium on VLSI Technology & Circuits Digest of Technical Papers, IEEE, Jun. 12, 2022.
(Continued)

*Primary Examiner* — Alexander Sofocleous
*Assistant Examiner* — Duy H Luong
(74) *Attorney, Agent, or Firm* — Harness, Dickey & Pierce, P.L.C.

(57) ABSTRACT

A storage device capable of performing erase operations in units smaller than blocks may include nonvolatile memory, and processing circuitry configured to, apply an erase voltage to a first bit line of the plurality of bit lines of at least one memory block of the plurality of memory blocks, apply an erase prohibition voltage to a second bit line of the plurality of bit lines, the erase prohibition voltage having a voltage level lower than a voltage level of the erase voltage, and float the common source line to cause an erasure of data stored in at least one first memory cell included in at least one first cell string connected to the first bit line by floating the common source line, and preserve data stored in at least one second memory cell included in at least one second cell string connected to the second bit line.

20 Claims, 16 Drawing Sheets

(51) Int. Cl.
*G11C 16/24* (2006.01)
*G11C 16/32* (2006.01)

(58) Field of Classification Search
USPC ..................................................... 365/185.29
See application file for complete search history.

(56) References Cited

U.S. PATENT DOCUMENTS

| | | | | |
|---|---|---|---|---|
| 10,354,734 | B2 | 7/2019 | Saito et al. | |
| 10,998,334 | B2 | 5/2021 | Lee et al. | |
| 11,817,153 | B2 | 11/2023 | Kim et al. | |
| 2014/0169093 | A1* | 6/2014 | Parat | G11C 16/16 365/185.11 |
| 2014/0226416 | A1* | 8/2014 | Li | G11C 16/0483 365/185.26 |
| 2015/0228347 | A1* | 8/2015 | Itagaki | G11C 16/0483 365/185.17 |
| 2016/0284413 | A1* | 9/2016 | Chang | G11C 16/0483 |
| 2021/0143179 | A1 | 5/2021 | Song et al. | |
| 2021/0151464 | A1 | 5/2021 | Fayrushin et al. | |
| 2022/0005826 | A1 | 1/2022 | Lim et al. | |
| 2022/0180948 | A1 | 6/2022 | Puthenthermadam et al. | |
| 2022/0199164 | A1* | 6/2022 | Kim | G11C 16/0483 |
| 2023/0035421 | A1 | 2/2023 | Lim et al. | |

OTHER PUBLICATIONS

Wang et al., "Drain-Erase Scheme in Ferroelectric Field-Effect Transistor—Part I: Device Characterization," IEEE Transactions on Electron Devices, vol. 67, No. 3, Mar. 2020.

Korean Office Action dated Jul. 29, 2026 issued in corresponding KR Patent Application No. 10-2022-0155803.

* cited by examiner

STORAGE DEVICE AND STORAGE SYSTEM INCLUDING THE SAME

CROSS-REFERENCE TO RELATED APPLICATION

This U.S. non-provisional application claims the benefit of priority under 35 U.S.C. § 119 to Korean Patent Application No. 10-2022-0155803, filed on Nov. 18, 2022, in the Korean Intellectual Property Office, the disclosure of which is incorporated by reference herein in its entirety.

BACKGROUND

Various example embodiments of the inventive concepts relate to a storage device, a system including the storage device, and/or a method of operating the storage device, and more particularly, to a storage device which may be erased in units smaller than blocks, a storage system including the storage device, and/or a method of operating the storage device, etc.

Flash memory is a nonvolatile memory device capable of retaining data even after power is removed. Storage devices including flash memory, such as solid-state drives (SSDs) and memory cards, are widely used, and may be useful for storing and/or transferring a large amount of data.

In general, programming of storage devices is performed in units of cells, but erasing of storage devices is performed in units of blocks, wherein each block unit is greater than a cell unit (e.g., includes a plurality of cells, etc.). Therefore, compared to the programing of storage devices, erasing of storage devices has a limitation in that the size of controllable units is large. To address this, storage devices configured to be erased in units smaller than blocks are desired and/or needed.

SUMMARY

Various example embodiments of the inventive concepts provide a storage device which may be erased in units smaller than blocks.

According to at least one example embodiment of the inventive concepts, there is provided a storage device including a three-dimensional (3D) nonvolatile memory including a plurality of memory blocks, each of the memory blocks including a plurality of cell strings connected to a common source line and a plurality of bit lines, and processing circuitry configured to, apply an erase voltage to a first bit line of the plurality of bit lines of at least one memory block of the plurality of memory blocks, apply an erase prohibition voltage to a second bit line of the plurality of bit lines, the erase prohibition voltage having a voltage level lower than a voltage level of the erase voltage, and float the common source line, the floating the common source line causing an erasure of data stored in at least one first memory cell included in at least one first cell string connected to the first bit line by floating the common source line, and preserve data stored in at least one second memory cell included in at least one second cell string connected to the second bit line.

According to at least one example embodiment of the inventive concepts, there is provided a three-dimensional (3D) nonvolatile memory comprising a plurality of memory blocks, each memory block of the plurality of memory blocks comprising a plurality of cell strings connected to a common source line and a plurality of bit lines, and processing circuitry configured to, erase data stored in at least one memory cell included in at least one first cell string connected to odd-numbered bit lines of the plurality of bit lines and preserve data stored in at least one memory cell included in at least one second cell string connected to even-numbered bit lines of the plurality of bit lines during a first erase period, and preserve data stored in the at least one memory cell included in the at least one first cell string and erase data stored in the at least one memory cell included in the at least one second cell string.

According to at least one example embodiment of the inventive concepts, there is provided a storage system including a storage device comprising a plurality of memory blocks, each of the memory blocks comprising a plurality of cell strings connected to a common source line and a plurality of bit lines, a host device configured to transfer an erase command to the storage device, and the storage device is configured to, in response to the erase command, apply an erase voltage to a first bit line of the plurality of bit lines, apply an erase prohibition voltage to a second bit line, the erase prohibition voltage having a voltage level lower than a voltage level of the erase voltage, and float the common source line, the floating including erasing data stored in at least one memory cell included in at least one first cell string of the plurality of cell strings, and preserve data stored in at least one memory cell included in at least one second cell string of the plurality of cell strings, the at least one first cell string connected to the first bit line and the at least one second cell string connected to the second bit line.

BRIEF DESCRIPTION OF THE DRAWINGS

Various example embodiments will be more clearly understood from the following detailed description taken in conjunction with the accompanying drawings in which.

DETAILED DESCRIPTION

Hereinafter, various example embodiments will be described with reference to the accompanying drawings.

Figure 1:
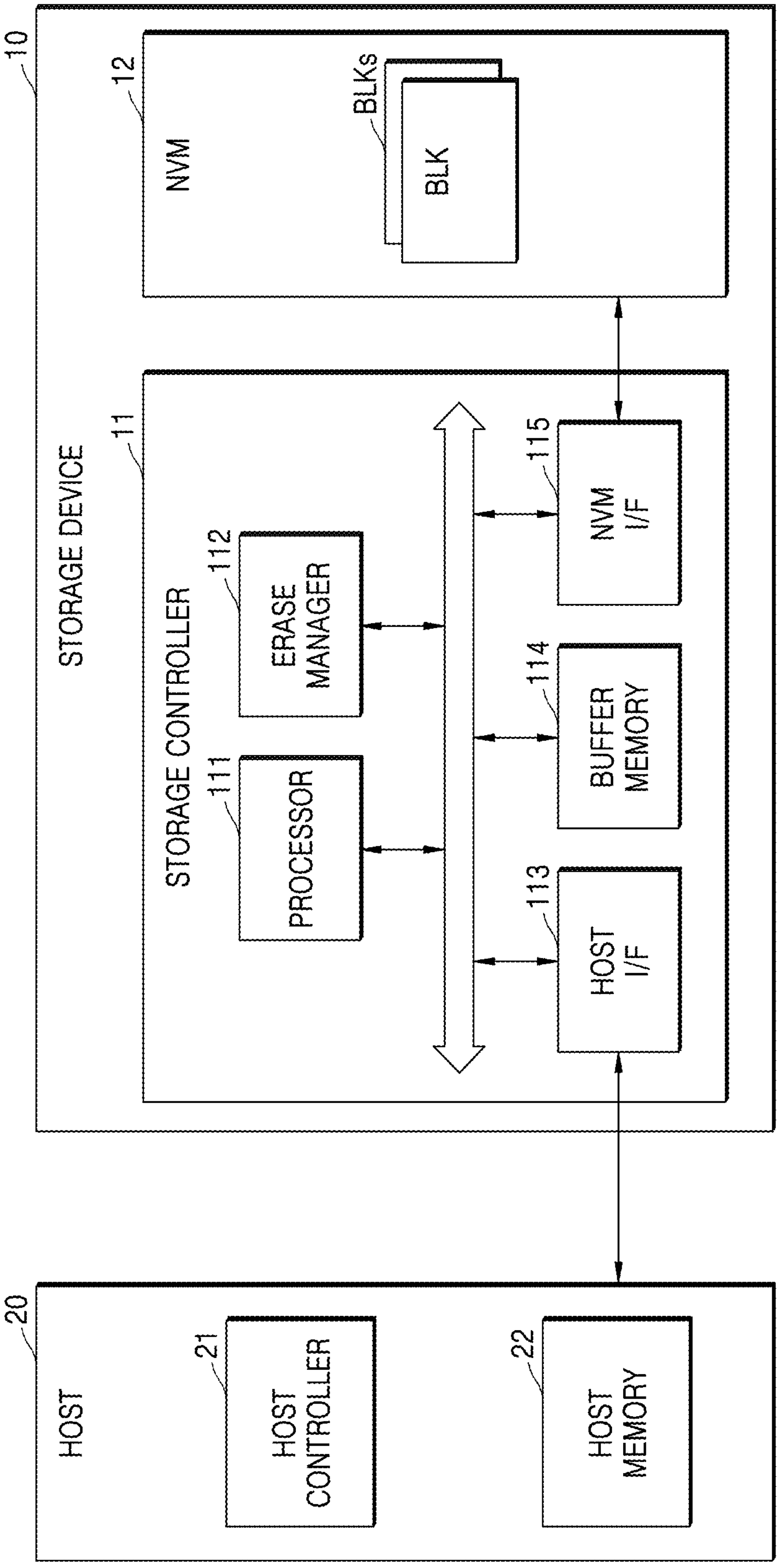
FIG. 1 is a block diagram illustrating a storage system according to at least one example embodiment.

FIG. 1 is a block diagram illustrating a storage system according to at least one example embodiment.

Referring to FIG. 1, the storage system may include a storage device 10 and a host 20, and the storage device 10 may include at least one memory controller 11 and/or at least one nonvolatile memory (NVM) 12 (e.g., NVM device, etc.), etc., but is not limited thereto, and for example, may include a greater or lesser number of constituent components. Depending on the example embodiment, the memory controller 11 may be referred to as a storage controller, a NVM controller, processing circuitry, etc.

Figure 3:
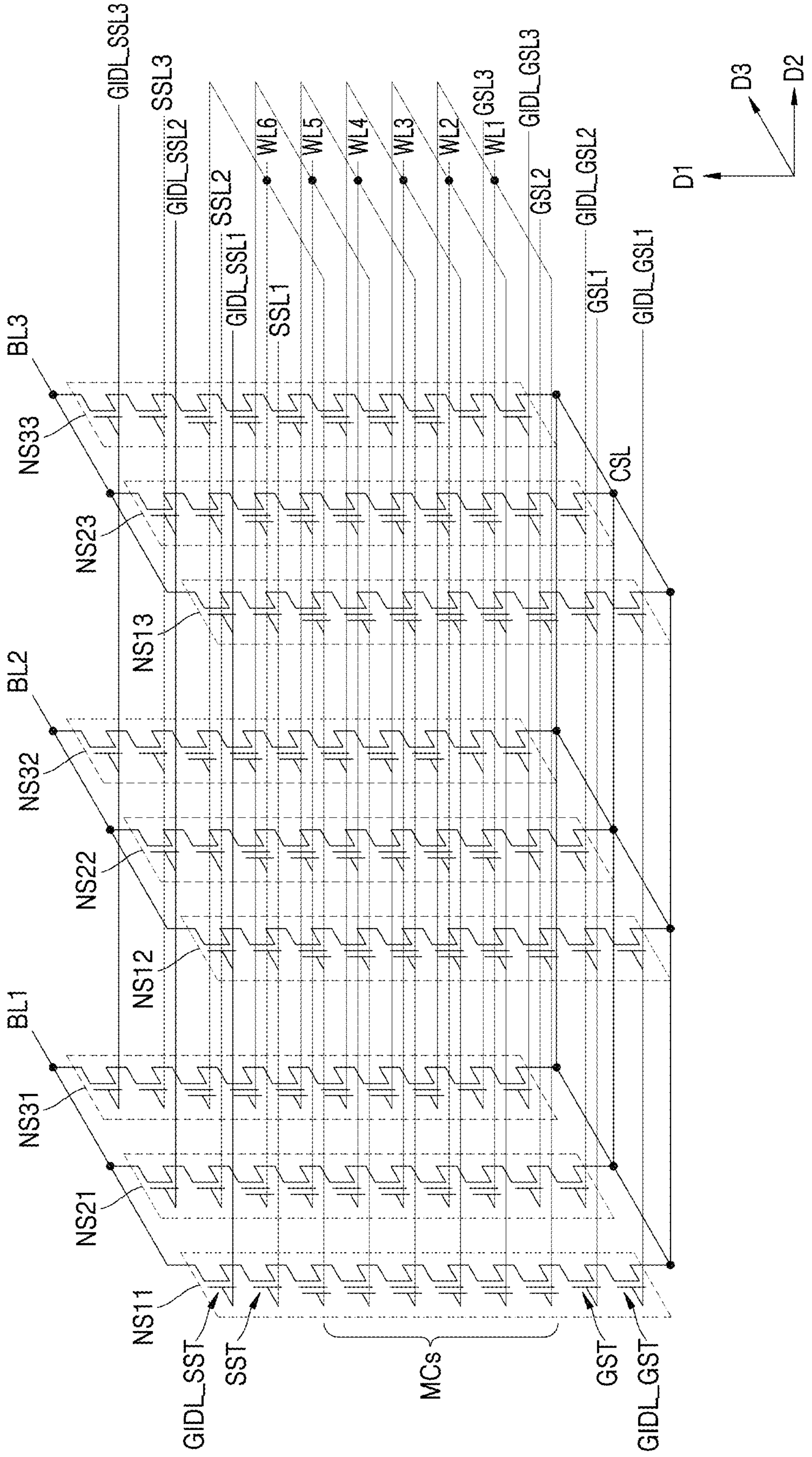
FIG. 3 is a circuit diagram illustrating an example of a memory block according to at least one example embodiment.

The NVM 12 may include a plurality of memory blocks BLKs. Each of the memory blocks BLKs may be connected to a common source line and/or a plurality of bit lines, etc. In addition, as shown in FIG. 3, each of the memory blocks BLKs may be connected to a plurality of gate induced drain leakage (GIDL) string select lines and/or a plurality of word lines, but is not limited thereto.

The memory controller 11 may communicate with the NVM 12 and may control erase operations of the memory blocks BLKs of the NVM 12 based on units smaller than the memory blocks BLKs. The expression "erase operations based on units smaller than memory blocks" may refer to erase operations based on and/or performed on bit lines, strings, cells, or the like, which contain and/or include a lesser number of cells than a number of cells included in a memory block BLK. The memory controller 11 may include at least one processor 111, at least one erase manager 112, at least one host interface 113, at least one buffer memory 114, and/or at least one NVM interface 115, which are capable of communicating with each other through buses, but the example embodiments are not limited thereto. According to at least one example embodiment, the memory controller 11 and/or the at least one processor 111, at least one erase manager 112, at least one host interface 113, at least one buffer memory 114, and/or at least one NVM interface 115, etc., may be implemented as processing circuitry and the processing circuitry may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto.

The erase manager 112 may manage a plurality of erase units for the memory blocks BLKs. For example, the erase manager 112 may control the NVM 12 such that the NVM 12 may be erased in units of bit lines, strings, or cells, each of which are smaller than a block unit (e.g., contain less cells than a block, etc.).

In at least one example embodiment, the erase manager 112 may control and/or perform an erase operation in units of bit lines (e.g., bit line units, etc.), but is not limited thereto. For example, under the control of the erase manager 112, an erase voltage may be applied to a first bit line of the plurality of bit lines, and an erase prohibition voltage (e.g., a preserve voltage, a save voltage, etc.) having a voltage level lower than the voltage level of the erase voltage may be applied to a second bit line of the plurality of bit lines. Here, the first bit line may refer to a bit line to be erased, and the second bit line may refer to a bit line prohibited from being erased (e.g., a preserved bit line, a bit line which is not to be erased, an unchanged bit line, a saved bit line, etc.). Under the control of and/or operation by the erase manager 112 (or in other words, the erase manager 112 may perform the following erase operations), the common source line on which the memory blocks BLKs are stacked may be floated to erase first cell strings connected to the first bit line. In addition, the erase manager 112 may control the NVM 12 to not apply voltage to an electrode connected to the common source line to float the common source line. In this manner, under the control of the erase manager 112, the NVM 12 may erase the plurality of first cell strings connected to the first bit line and avoid erasing the plurality of second cell strings connected to the second bit line (e.g., prevent the second cell strings connected to the second bit line from being erased, etc.).

In some example embodiments, when the erase manager 112 performs an erase operation based on bit lines, the erase manager 112 may control the NVM 12 such that the NVM 12 may apply an erase voltage to a third bit line, which is adjacent to the second bit line but is not adjacent to the first bit line, to erase a plurality of memory cells of a plurality of cell strings connected to the third bit line among a plurality of cell strings of the memory blocks BLKs. In other words, when the erase manager 112 performs an erase operation based on one or more bit lines, the erase manager 112 may not (and/or may avoid) simultaneously erase cell strings connected to adjacent bit lines.

In some example embodiments, the erase manager 112 may check the dispersion of threshold voltages of memory cells connected to the bit lines, and may control a repetitive erase operation such that the dispersion of threshold voltages may be less than a threshold value (e.g., a desired threshold voltage value). Here, the threshold value may be determined by (and/or may be based on) a desired time and/or a desired power of an erase operation, but is not limited thereto.

In at least one example embodiment, the erase manager 112 may control (e.g., perform) erase operations in units of strings (e.g., string units, etc.). For example, in addition to one or more conditions for bit-line-based erase operations ground voltage may be applied to a first GIDL string select line for a first time period (e.g., first desired time period, etc.) and the first GIDL string select line may be floated under the control of the erase manager 112, but the example embodiments are not limited thereto. In addition, the ground voltage may be applied to a second GIDL string select line for a second time period (e.g., a second desired time period, etc.) shorter than the first time period and the second GIDL string select line may be floated under the control of the erase manager 112, but the example embodiments are not limited thereto.

In addition, the erase manager 112 may control, set, and/or adjust the magnitude of voltage between the first bit line and the first GIDL string select line, that is, the magnitude of a first detection voltage, to be greater than the magnitude of voltage between the first bit line and the second GIDL string select line, that is, the magnitude of a second detection voltage, etc. Through this, the erase manager 112 may adjust the magnitude of a second GIDL current flowing through a channel of a second cell string connected to the first bit line and the second GIDL string select line to be less than the magnitude of a first GIDL current flowing through a channel of a first cell string connected to the first bit line and the first GIDL string select line, but the example embodiments are not limited thereto. The GIDL current may refer to current flowing through a channel of a GIDL string select transistor connected to a GIDL string select line. The magnitude of GIDL current flowing in a cell string to be erased may be greater than the magnitude of GIDL current in a cell string not to be erased (e.g., preserved, saved, etc.).

In at least one example embodiment, the erase manager 112 may control (e.g., perform) one or more erase operations in units of cells (e.g., cell units), etc. For example, in addition to controlling one or more conditions for string-based erase operations, the erase manager 112 may control the NVM 12 to erase a first memory cell by applying a ground voltage to a first word line, applying the ground voltage to a second word line for a second time period, and then floating the second word line, but is not limited thereto.

As described above, the erase manager 112 may control (e.g., perform) at least one selected of a bit-line-based erase operation, a string-based erase operation, and/or a cell-based erase operation for each of the memory blocks BLKs, etc., but the example embodiments are not limited thereto, and for example, may further include a block-based erase operation, a page-based erase operation, etc.

According to some example embodiments, the erase manager 112 may be implemented as software executed by processing circuitry, firmware executed by processing circuitry, and/or hardware. In at least one example embodiment, the erase manager 112 may be implemented as software (e.g., computer readable instructions, computer code, etc.), and the memory controller 11 may further include a working memory into which the erase manager 112 is loaded, but the example embodiments are not limited thereto. The processor 111 may control an erase operation for the NVM 12 by executing the software corresponding to the erase manager 112. For example, the working memory may be implemented as volatile memory, such as static random access memory (SRAM) and/or dynamic random access memory (DRAM), etc., and/or as NVM such as flash memory and/or phase random access memory (PRAM), etc., but is not limited thereto.

According to at least one example embodiment, the processor 111 may include a central processing unit (CPU) and/or a microprocessor, etc., and may control overall operations of the memory controller 11. In at least one example embodiment, the processor 111 may be implemented as a multi-core processor, such as a dual-core processor, a quad-core processor, etc. The buffer memory 114 may temporarily store data to be written into the NVM 12 and/or temporarily store data read from the NVM 12. The buffer memory 114 may be included in the memory controller 11 and/or may be provided outside (e.g., external to) the memory controller 11. For example, the memory controller 11 may further include a buffer memory manager and/or a buffer memory interface for communication with the buffer memory 114, etc., but the example embodiments are not limited thereto.

The host interface 113 may exchange one or more packets with the host 20 (e.g., a host device, etc.). A packet transmitted from the host 20 to the host interface 113 may include a command and/or data to be written into the NVM 12, and a packet transmitted from the host interface 113 to the host 20 may include a response to a command and/or data read from the NVM 12, etc. The NVM interface 115 may transmit data to the NVM 12 which is to be written into the NVM 12, and may receive data read from the NVM 12, etc. The NVM interface 115 may be implemented to comply with standard protocols such as Toggle or Open NAND Flash Interface (ONFI), but the example embodiments are not limited thereto.

The storage device 10 may include storage media for storing data according to and/or based on requests from the host 20. For example, the storage device 10 may include at least one of solid state drives (SSDs), embedded memory, and/or removable external memory, etc., but the example embodiments are not limited thereto. When the storage device 10 includes an SSD, the storage device 10 may comply with the nonvolatile memory express (NVMe) protocol, but the example embodiments are not limited thereto. When the storage device 10 includes embedded memory and/or external memory, the storage device 10 may comply with the universal flash storage (UFS) protocol and/or embedded multi-media card (eMMC) protocol, but is not limited thereto. The host 20 and the storage device 10 may each generate and/or transmit packets according to an adopted standard protocol.

In at least one example embodiment, the host 20 may include at least one host controller 21 and/or at least one host memory 22, etc., but is not limited thereto. The host controller 21 may manage an operation of transferring data from of a buffer area of the host memory 22 to the NVM 12 and/or transferring data from the NVM 12 to the buffer area of the host memory 22, etc. The host memory 22 may function as a buffer memory for temporarily storing data to be transmitted to the storage device 10 and/or temporarily store data transmitted from the storage device 10, but is not limited thereto. For example, the host controller 21 may be any one of a plurality of modules included in an application processor, and the application processor may be implemented as a system-on-chip (SoC), but the example embodiments are not limited thereto. In addition, the host memory 22 may be an embedded memory included in the application processor, and/or may be a NVM and/or a memory module provided outside (e.g., external to) the application processor, etc.

As described above, the storage device 10 may perform erase operations in units of bit lines (e.g., bit line-based units), strings (e.g., string-based units), and/or cells (e.g., cell-based units) that are smaller than the memory blocks BLKs (e.g., block-based units). In addition, the storage device 10 may perform erase operations based on different memory size units for each of the memory blocks BLKs.

Figure 2:
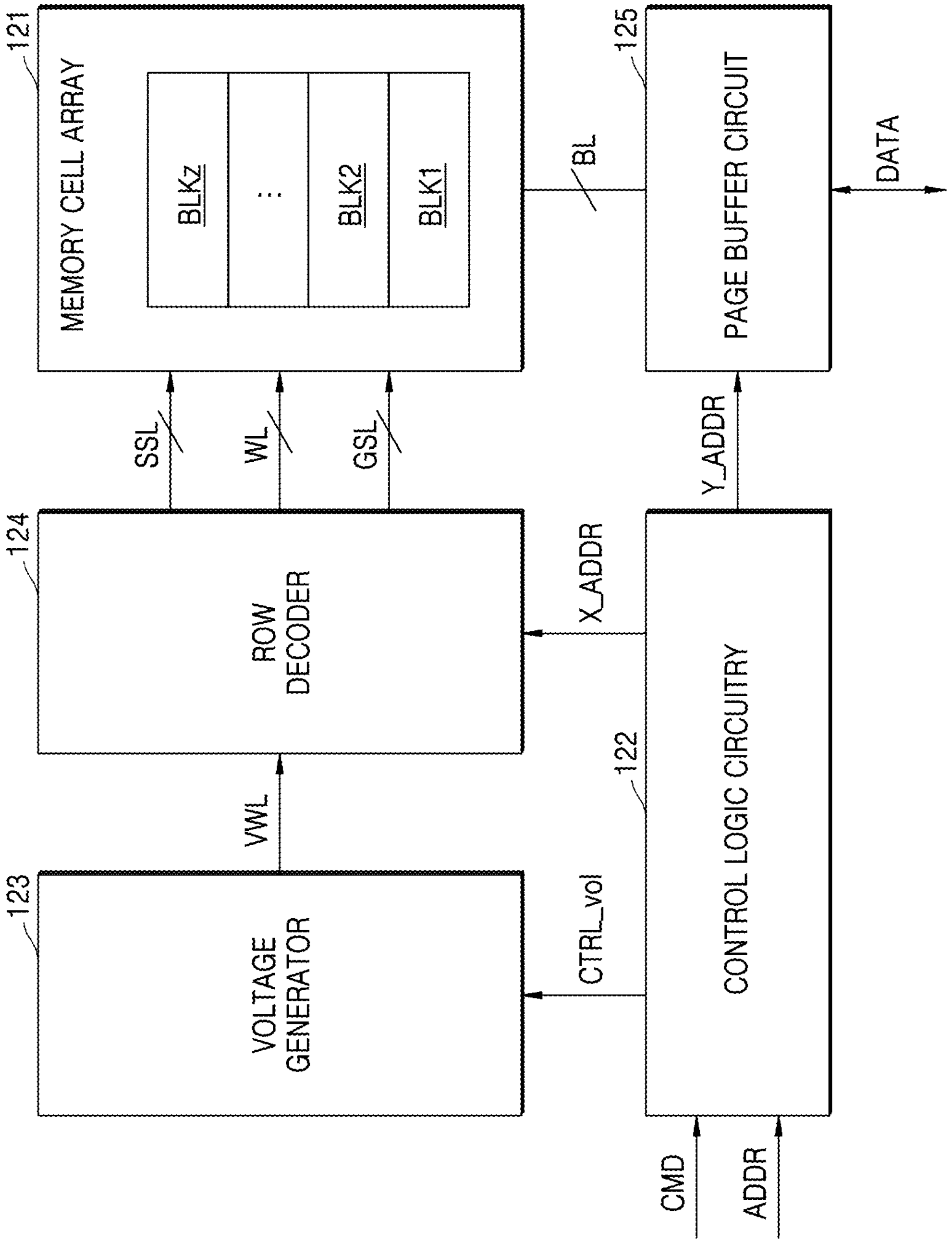
FIG. 2 is a block diagram illustrating a nonvolatile memory according to at least one example embodiment.

FIG. 2 is a block diagram illustrating an NVM according to at least one example embodiment.

Referring to FIG. 2, the NVM may include a memory cell array 121, control logic circuitry 122, a voltage generator 123, a row decoder 124, and/or a page buffer circuit 125, etc., but the example embodiments are not limited thereto. The NVM may correspond to an implementation example of the NVM 12 shown in FIG. 1, but the example embodiments are not limited thereto. According to at least one example embodiment, the control logic circuitry 122, the voltage generator 123, the row decoder 124, and/or the page buffer circuit 125, etc., may be implemented as processing circuitry.

The memory cell array 121 may include a plurality of memory blocks BLK1 to BLKz, and each of the memory blocks BLK1 to BLKz may include a plurality of pages PG1 to PGc, where z and c may be positive integers and may be variously changed according to some example embodiments. The memory cell array 121 may be connected to the page buffer circuit 125 through bit lines BL, and may be connected to the row decoder 124 through word lines WL, string select lines SSL, and ground select lines GSL.

In at least one example embodiment, the memory cell array 121 may include a three-dimensional (3D) memory cell array, and the 3D memory cell array may include a plurality of NAND strings, but is not limited thereto. Each of the NAND strings may include memory cells respectively connected to word lines that are vertically stacked on a substrate.

In at least one example embodiment, the memory cell array 121 may include a flash memory, and the flash memory may include a two-dimensional (2D) NAND memory array and/or a 3D vertical NAND (VNAND) memory array, but the example embodiments are not limited thereto. In some example embodiments, the memory cell array 121 may include various other types of NVMs. Examples of the memory cell array 121 may include magnetic RAM (MRAM), spin-transfer torque MRAM (spin-transfer torque MRAM), conductive bridging RAM (CBRAM), ferroelectric RAM (FeRAM), PRAM, resistive RAM (RRAM), and/or various other types of memories.

The control logic circuitry 122 may generally control various operations of the NVM 12. The control logic circuitry 122 may output various control signals in response to commands CMD and/or addresses ADDR. For example, the control logic circuitry 122 may output a voltage control signal CTRL_vol, a row address X_ADDR, and/or a column address Y_ADDR, etc. The voltage generator 123 may generate various types of voltages for program (e.g., write), read, and/or erase operations, etc., based on the voltage control signal CTRL_vol. For example, the voltage generator 123 may generate a program voltage (e.g., a write voltage), a read voltage, a program verification voltage, an erase voltage, and/or the like as a word line voltage VWL.

The row decoder 124 may select one of the word lines WL and one of the string select lines SSL in response to the row address X_ADDR. For example, the row decoder 124 may apply a program voltage and a program verification voltage to the selected word line during a program operation, and a read voltage to the selected word line during a read operation, etc. The page buffer circuit 125 may select at least one bit line from the bit lines BL in response to the column address Y_ADDR. The page buffer circuit 125 may operate as a write driver and/or a sense amplifier according to and/or based on an operation mode, but is not limited thereto.

FIG. 3 is a circuit diagram illustrating a memory block according to at least one example embodiment.

The memory block shown in FIG. 3 is an example of one of the memory blocks BLK1 to BLKz described with reference to FIG. 2, but the example embodiments are not limited thereto. For example, a first memory block BLK1 is shown as an example. The first memory block BLK1 is a 3D memory block having a 3D structure formed on a substrate, but is not limited thereto. A plurality of memory cell strings of the first memory block BLK1 may be formed in a direction D1 perpendicular to the substrate, but is not limited thereto.

Referring to FIG. 3, the first memory block BLK1 may include a plurality of cell strings, e.g., cell strings NS11 to NS33, a plurality of word lines, e.g., word lines WL1 to WL6, a plurality of bit lines, e.g., bit lines BL1 to BL3, a plurality of GIDL ground select lines, e.g., GIDL ground select lines GIDL_GSL1 to GIDL_GSL3, a plurality of ground select lines, e.g., ground select lines GSL1 to GSL3, a plurality of GIDL string select lines, e.g., GIDL string select lines GIDL_SSL1 to GIDL_SSL3, a plurality of string select lines, e.g., string select lines SSL1 to SSL3, and/or a common source line CSL, etc., but is not limited thereto. Although FIG. 3 illustrates that each of the cell strings NS11 to NS33 includes six memory cells MCs connected to six word lines WL1 to WL6, the example embodiments of the inventive concepts are not limited thereto.

Each of the cell strings NS11 to NS33 (for example, a cell string NS11, etc.) may include a GIDL string select transistor GIDL_SST, a string select transistor SST, a plurality of memory cells MCs, a GIDL ground select transistor GIDL_GST, and a ground select transistor GST that are connected in series to each other, etc. The GIDL string select transistor GIDL_SST may be connected to a corresponding GIDL string select line GIDL_SSL1, and the string select transistor SST may be connected to a corresponding string select line SSL1, etc. The memory cells MCs may be respectively connected to the word lines, e.g., word lines WL1 to WL6, etc. The GIDL ground select transistor GIDL_GST may be connected to a corresponding GIDL ground select line GIDL_GSL1, and the ground select transistor GST may be connected to a corresponding ground select line GSL1. The GIDL string select transistor GIDL_SST may be connected to a corresponding bit line BL1 and the GIDL ground select transistor GIDL_GST may be connected to the common source line CSL.

In the cell strings NS11 to NS33, word lines (for example, WL1) having the same height may be connected in common, and the GIDL ground select lines GIDL_GSL1 to GIDL_GSL3, the ground select lines GSL1 to GSL3, the GIDL string select lines GIDL_SSL1 to GIDL_SSL3, and the string select lines SSL1 to SSL3 may be separate from each other, etc. In general, unlike the GIDL string select lines GIDL_SSL1 to GIDL_SSL3 and the string select lines SSL1 to SSL3, the GIDL ground select lines GIDL GSL1 to GIDL_GSL3 and the ground select lines GSL1 to GSL3 may be provided in units of blocks and/or may be additionally separated to improve performance.

Figure 4:
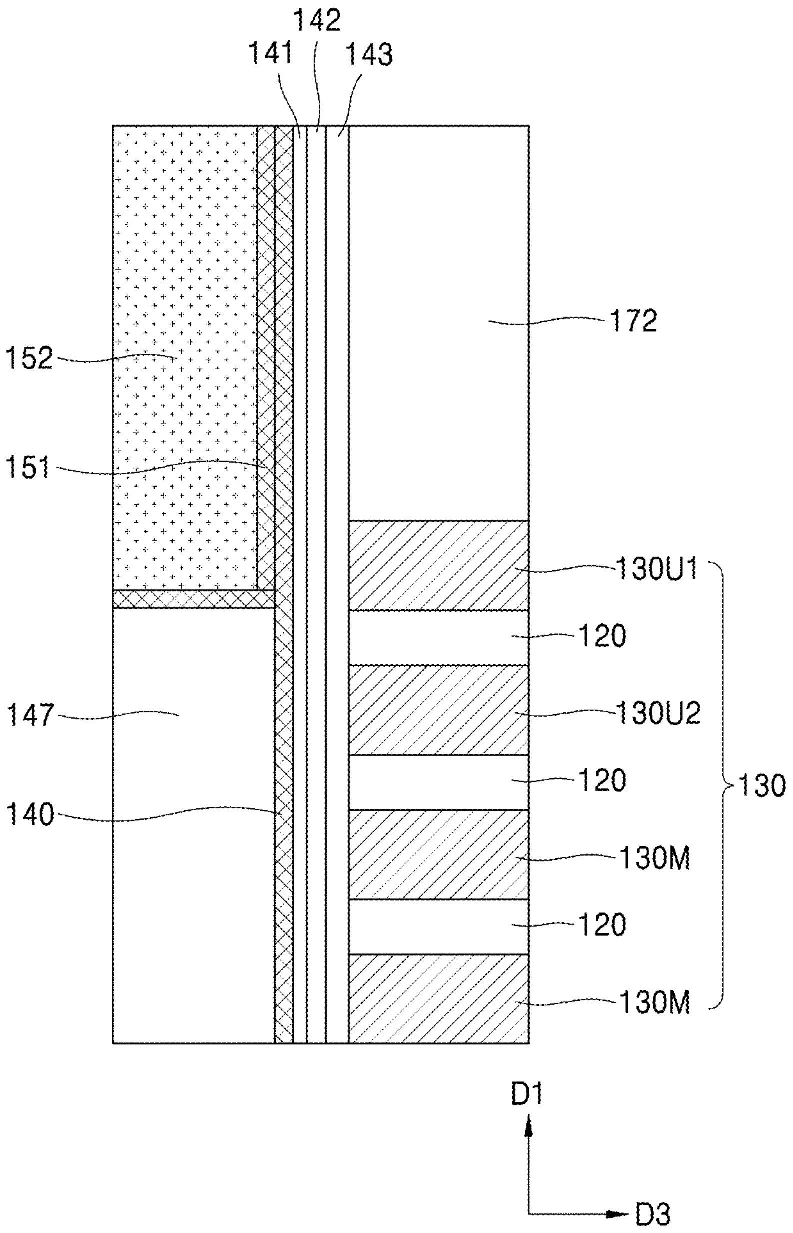
FIG. 4 is an enlarged view illustrating a portion of a cell string according to at least one example embodiment.

FIG. 4 is an enlarged view illustrating a portion of a cell string according to at least one example embodiment. For example, FIG. 4 may be an enlarged view illustrating a portion of the cell string NS11 shown in FIG. 3, but the example embodiments are not limited thereto.

Referring to FIG. 4, the cell string may include one or more interlayer insulating layers 120, one or more gate electrodes 130, at least one channel layer 140, at least one tunneling layer 141, at least one information storage layer 142, at least one blocking layer 143, at least one core insulating layer 147, at least one first pad layer 151, and/or at least one second pad layer 152, etc., but is not limited thereto.

The interlayer insulating layers 120 may be between the gate electrodes 130, but is not limited thereto. Like the gate electrodes 130, the interlayer insulating layers 120 may be stacked apart from each other in a vertical direction (e.g., first direction D1), but the example embodiments are not limited thereto. The interlayer insulating layers 120 may include an insulating material, such as silicon oxide, silicon nitride, and/or silicon oxynitride, etc.

A first upper gate electrode 130U1 may be a gate electrode of the GIDL string select transistor GIDL_SST described with reference to FIG. 3, but is not limited thereto. A second upper gate electrode 130U2 may be a gate electrode of the string select transistor SST described with reference to FIG. 3, but is not limited thereto. Middle gate electrodes 130M may correspond to word lines WL.

The channel layer 140 may extend between the first upper gate electrode 130U1 and the first pad layer 151, but is not limited thereto.

The tunneling layer 141 may tunnel charges into the information storage layer 142. The tunneling layer 141 may include, for example, silicon oxide (SiO), silicon oxynitride (SiON), etc., or any combinations thereof. The information storage layer 142 may be a charge trap layer. The information storage layer 142 may include, for example, silicon nitride (SiN). The blocking layer 143 may include silicon oxide (SiO), silicon oxynitride (SiON), a high-k dielectric material, etc., or any combinations thereof.

The first pad layer 151 may include undoped (e.g., not-intentionally-doped) polysilicon, and may serves as a diffusion buffer layer between the second pad layer 152 and the channel layer 140, but the example embodiments are not limited thereto. For example, to form a depletion region, the first pad layer 151 may have a function of buffering the diffusion of a dopant by intentionally diffusing the dopant from the second pad layer 152 to form a dopant concentration gradient. In other words, the first pad layer 151 may decrease the concentration of the dopant to a desired and/or predetermined value or less in a region adjacent to the channel layer 140, but is not limited thereto.

According to at least one example embodiment, the first pad layer 151 and/or the second pad layer 152 may be referred to as a pad layer of a bit line (for example, the bit line BL1 shown in FIG. 3), but the example embodiments are not limited thereto. The first and second pad layers 151 and 152 of the bit line may overlap the GIDL string select transistor GIDL_SST in a first direction D1 perpendicular to the bit line, but is not limited thereto.

Figure 5A:
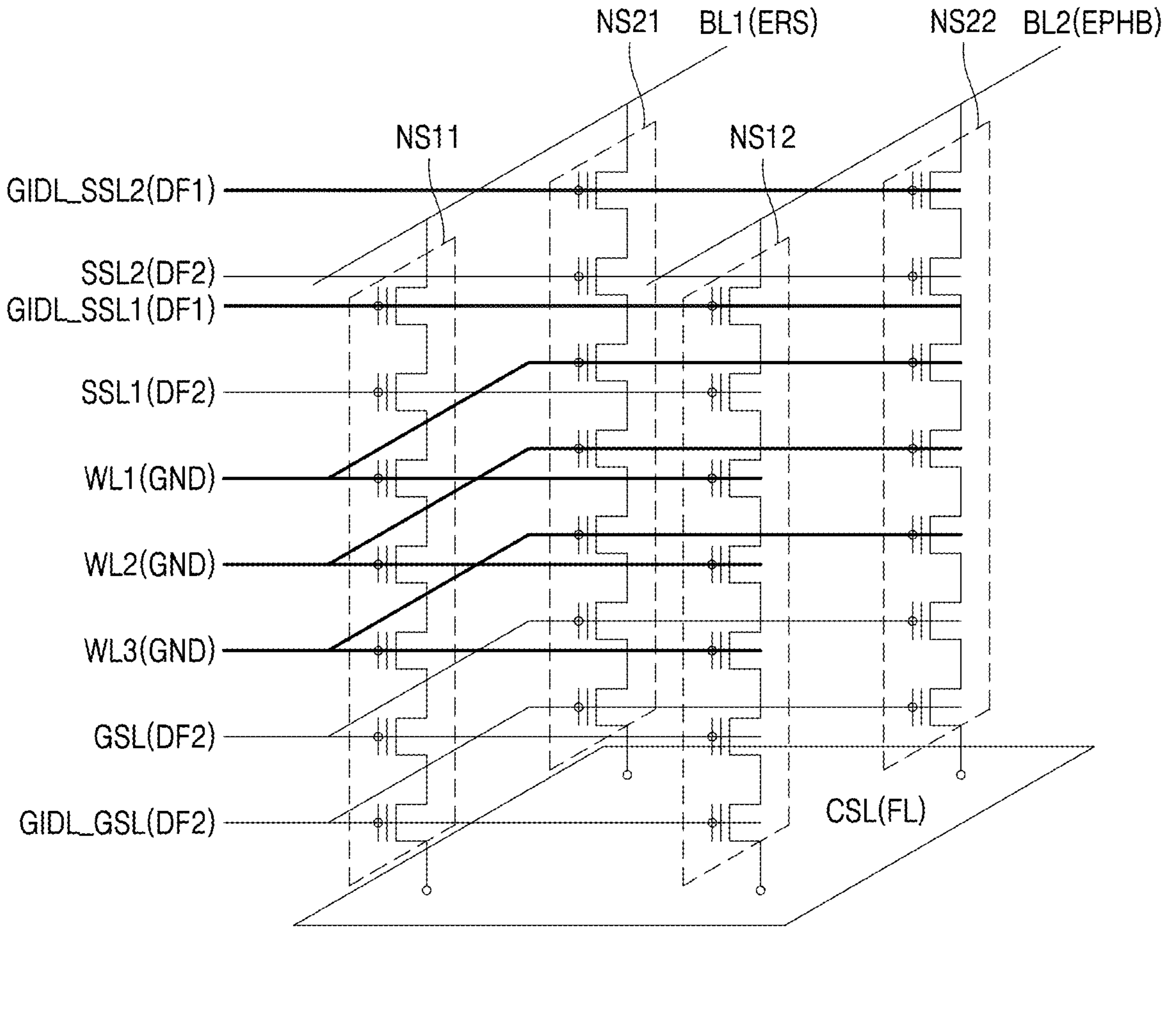
FIGS. 5A and 5B are views illustrating bias voltage conditions for an erase operation according to at least one example embodiment.
Figure 5B:
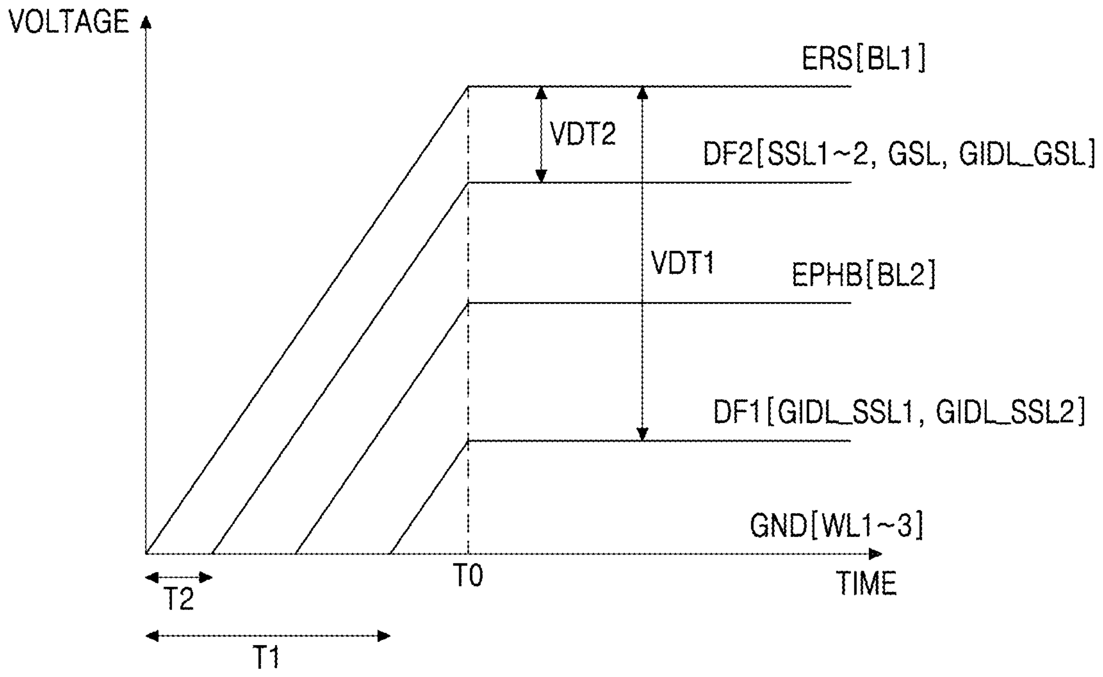

FIGS. 5A and 5B are views illustrating bias voltage conditions for an erase operation according to at least one example embodiment. FIGS. 5A and 5B may be described with reference to FIG. 1, but the example embodiments are not limited thereto.

FIG. 5A is a view illustrating bias voltage conditions for cell strings during a bit-line-based erase operation, and FIG. 5B is a view illustrating bias voltage levels shown in FIG. 5A with respect to time, but the example embodiments are not limited thereto.

For ease of illustration and the sake of clarity and brevity, FIG. 5A illustrates the cell strings NS11 and NS21 connected to the first bit line BL1, and the cell strings NS12 and NS22 connected to the second bit line BL2 among the cell strings NS11 to NS33 of the first memory block BLK1, but the example embodiments are not limited thereto.

Referring to FIGS. 5A and 5B, when the cell strings NS11 and NS21 connected to the first bit line BL1 are erased, a relatively high voltage, for example, an erase voltage ERS, may be applied to the first bit line BL1. In addition, when data stored in the cell strings NS12 and NS22 connected to the second bit line BL2 are not to be erased, a relatively low program voltage, for example, an erase prohibition voltage EPHB, may be applied to the second bit line BL2. According to at least one example embodiment, a bit line to which an erase voltage ERS is applied may be referred to as a bit line to be erased, and a bit line to which an erase prohibition voltage EPHB is applied may be referred to as an erase prohibition bit line.

A first delayed floating voltage DF1 may be applied to a first GIDL string select line GIDL_SSL1 and a second GIDL string select line GIDL_SSL2 that are connected to the cell string NS11. Here, as shown in FIG. 5B, after a first time period T1 during which ground voltage GND is applied, the first delayed floating voltage DF1 may rise until a time point T0 while maintaining a voltage level lower than the erase voltage ERS by a first detection voltage VDT1, but the example embodiments are not limited thereto.

Under the control of the erase manager 112, the ground voltage GND may be applied to each of the first GIDL string select line GIDL_SSL1 and the second GIDL string select line GIDL_SSL2 during the first time period T1, and then each of the first GIDL string select line GIDL_SSL1 and the second GIDL string select line GIDL_SSL2 may be floated to apply the first delayed floating voltage DF1 to the each of the first GIDL string select line GIDL_SSL1 and the second GIDL string select line GIDL_SSL2, etc.

Once a first GIDL string select transistor connected to the first bit line BL1 and the first GIDL string select line GIDL_SSL1 is turned on, a desired current (e.g., an erase current, a current sufficient for an erase operation, etc.) may flow through the cell string NS11 including the first GIDL string select transistor. For example, among the memory cells of the cell string NS11, memory cells connected to the word lines WL1 to WL3 to which the ground voltage GND is applied may generate an electric field (e.g., a strong electric field) because of a voltage difference between a channel and the word lines WL1 to WL3. Due to the electric field, e.g., strong electric field, electrons stored in the memory cells connected to the word lines WL1 to WL3 to which the ground voltage GND is applied may be tunneled into the channel, and thus data stored in the memory cells connected to the word lines WL1 to WL3 to which the ground voltage GND is applied may be erased.

Similarly, once a second GIDL string select transistor connected to the first bit line BL1 and the second GIDL string select line GIDL_SSL2 is turned on, a desired current (e.g., an erase current, a current sufficient for an erase operation, etc.) may flow through the cell string NS21 including the second GIDL string select transistor. Therefore, among the memory cells of the cell string NS21, data stored in memory cells connected to the word lines WL1 to WL3 to which the ground voltage GND is applied may be erased owing to a voltage difference between a channel and the word lines WL1 to WL3, etc.

However, in the case of the second bit line BL2 to which the erase prohibition voltage EPHB is applied, channels of the cell strings NS12 and NS22 may have a relatively low voltage level compared with the case of the first bit line BL1 to which the erase voltage ERS is applied, and thus data stored in the memory cells connected to the word lines WL1 to WL3 to which the ground voltage GND is applied may not be erased because of a voltage difference (e.g., a relatively small voltage difference) between the channels and the word lines WL1 to WL3. Therefore, according to at least one example embodiment, erase operations using the same size unit as programming and/or write operations may be performed by the non-volatile memory device, and there may be a decrease and/or reduction of undesired and/or unnecessary data stored in memory cells of the same memory block from being erased. Moreover, the preserved data stored in the memory cells associated with the second bit line BL2 do not have to be rewritten into the memory block, thereby reducing energy consumption of the non-volatile memory device, etc.

A second delayed floating voltage DF2 may be applied to a first string select line SSL1, a second string select line SSL2, a ground select line GSL, and a GIDL ground select line GIDL_GSL that are connected to the cell string NS11, but the example embodiments are not limited thereto. Here, as shown in FIG. 5B, after a second time period T2 during which the ground voltage GND is applied, the second delayed floating voltage DF2 may rise until the time point T0 while maintaining a voltage level lower than the erase voltage ERS by a second detection voltage VDT2.

Under the control of the erase manager 112, the ground voltage GND may be applied to each of the first string select line SSL1, the second string select line SSL2, the ground select line GSL, and the GIDL ground select line GIDL_GSL during the second time period T2, and then each of the first string select line SSL1, the second string select line SSL2, the ground select line GSL, and the GIDL ground select line GIDL_GSL may be floated to apply the second delayed floating voltage DF2 to each of the first string select line SSL1, the second string select line SSL2, the ground select line GSL, and the GIDL ground select line GIDL_GSL, but the example embodiments are not limited thereto.

Memory cells connected to the first string select line SSL1, the second string select line SSL2, the ground select line GSL, and the GIDL ground select line GIDL_GSL may be turned on, but the data stored in the memory cells may not be erased because of a voltage difference, e.g., a small voltage difference, between the channels and the first string select line SSL1, the second string select line SSL2, the ground select line GSL, and the GIDL ground select line GIDL_GSL to which the second delayed floating voltage DF 2 is applied, etc. A floating voltage FL may be applied to the common source line CSL to decrease and/or prevent block-based erasing. The erase manager 112 may apply the floating voltage FL to the common source line CSL by floating the common source line CSL from the time point when the voltage level of the first bit line BL1 rises. In this case, the floating voltage FL may be determined according to and/or based on a capacitance distribution between the GIDL ground select line GIDL_GSL and a channel voltage, etc.

During the bit-line-based erase operation, the ground voltage GND may be applied to the word lines WL1 to WL3, etc.

In this manner, the erase manager 112 may control an erase operation in units of bit lines (e.g., bit line-based units) for memory cells of a memory block.

Figure 6A:
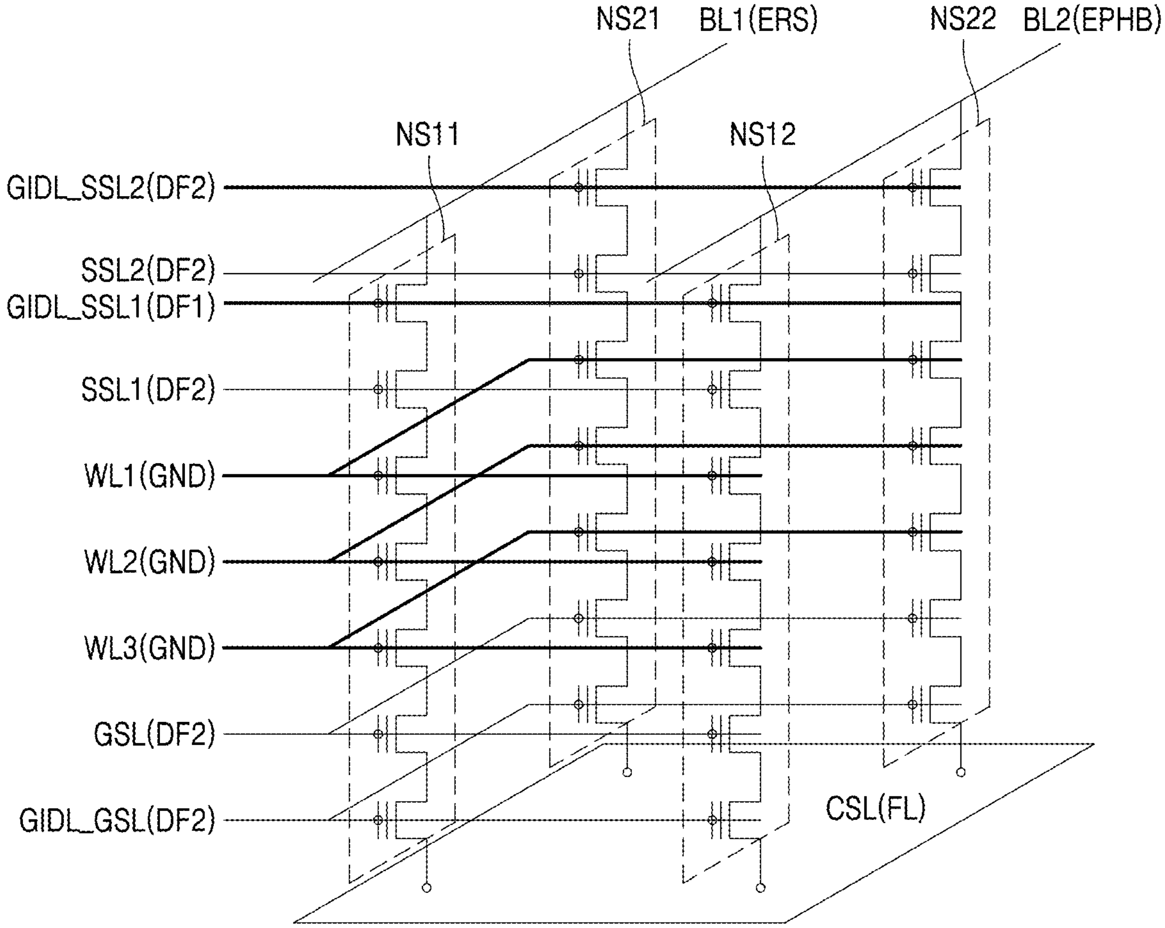
FIGS. 6A and 6B are views illustrating bias voltage conditions for an erase operation according to at least one example embodiment.
Figure 6B:
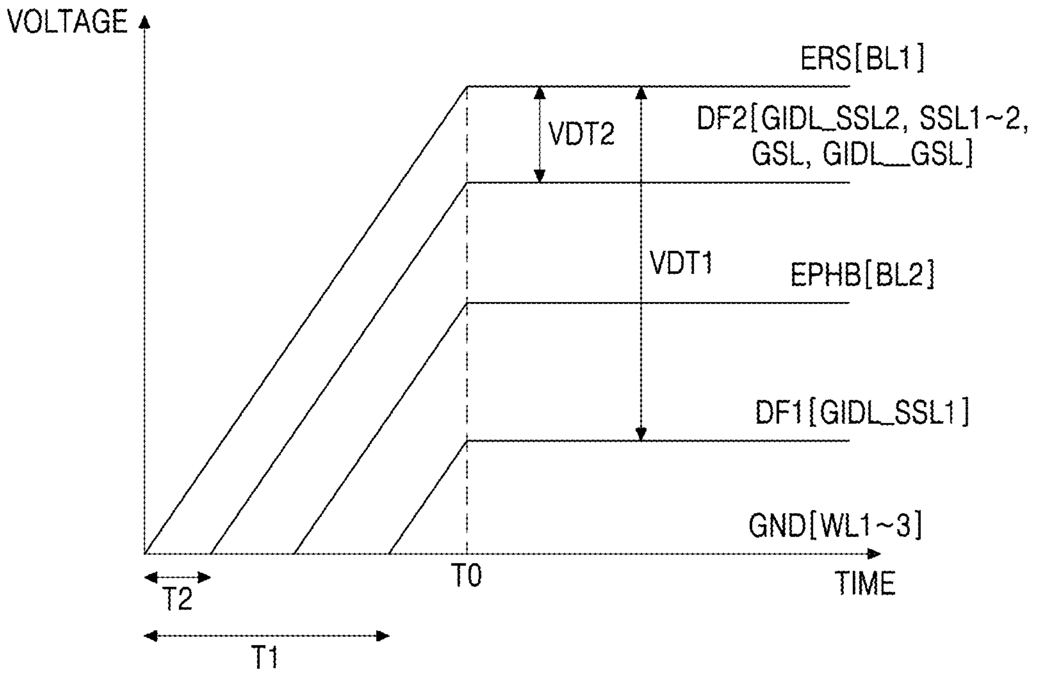

FIGS. 6A and 6B are views illustrating bias voltage conditions for an erase operation according to at least one example embodiment. FIGS. 6A and 6B may be described with reference to FIG. 1, but the example embodiments are not limited thereto.

In the following descriptions of FIGS. 6A and 6B, description of the features previously discussed in connection with FIGS. 5A and 5B have been omitted.

FIG. 6A is a view illustrating bias voltage conditions for cell strings during a string-based erase operation, and FIG. 6B is a view illustrating bias voltage levels shown in FIG. 6A with respect to time, but the example embodiments are not limited thereto.

A first delayed floating voltage DF1 may be applied to the first GIDL string select line GIDL_SSL1 connected to the cell string NS11, etc. In addition, a second delayed floating voltage DF2 may be applied to the second GIDL string select line GIDL_SSL2 connected to the cell string NS21, etc.

Under the control of the erase manager 112, ground voltage GND may be applied to the first GIDL string select line GIDL_SSL1 for a first time period T1, and then the first GIDL string select line GIDL_SSL1 may be floated to apply the first delayed floating voltage DF1 to the first GIDL string select line GIDL_SSL1, but the example embodiments are not limited thereto. In addition, under the control of the erase manager 112, the ground voltage GND may be applied to the second GIDL string select line GIDL_SSL2 for a second time period T2, and then the second GIDL string select line GIDL_SSL2 may be floated to apply the second delayed floating voltage DF2 to the second GIDL string select line GIDL_SSL2, etc.

Once the first GIDL string select transistor connected to the first bit line BL1 and the first GIDL string select line GIDL_SSL1 is turned on by the erase manager 112, a current sufficient for an erase operation may flow through the cell string NS11 including the first GIDL string select transistor, etc. For example, among the memory cells of the cell string NS11, memory cells connected to the word lines WL1 to WL3 to which the ground voltage GND is applied may generate a strong electric field because of a voltage difference between a channel and the word lines WL1 to WL3, etc. Due to the strong electric field, electrons stored in the memory cells connected to the word lines WL1 to WL3 to which the ground voltage GND is applied may be tunneled into the channel, and thus the data stored in the memory cells connected to the word lines WL1 to WL3 to which the ground voltage GND is applied may be erased.

Although the second GIDL string select transistor connected to the first bit line BL1 and the second GIDL string select line GIDL_SSL2 may be turned on, a current sufficient for an erase operation may not flow through the cell string NS21 including the second GIDL string select transistor. For example, electrons stored in the memory cells of the cell string NS21 that are connected to the word lines WL1 to WL3 to which the ground voltage GND is applied may not tunnel because of a small voltage difference between a channel and the word lines WL1 to WL3, and thus the data stored in the memory cells connected to the word lines WL1 to WL3 to which the ground voltage GND is applied may not be erased (e.g., may be preserved, saved, etc.).

In the case of the second bit line BL2 to which an erase prohibition voltage EPHB is applied by the erase manager 112, the channels of the cell strings NS12 and NS22 may have a relatively low voltage level compared with the case of the first bit line BL1 to which an erase voltage ERS is applied, and thus data stored in the memory cells connected to the word lines WL1 to WL3 to which the ground voltage GND is applied may not be erased (e.g., may be preserved, saved, etc.) because of a small voltage difference between the channels and the word lines WL1 to WL3.

Although memory cells connected to the second GIDL string select line GIDL_SSL2, the second string select line SSL2, the first string select line SSL1, the ground select line GSL, and the GIDL ground select line GIDL_GSL to which the second delayed floating voltage DF2 is applied may be turned on, the data stored in the memory cells may not be erased because of a small voltage difference between channels and the second GIDL string select line GIDL_SSL2, the second string select line SSL2, the first string select line SSL1, the ground select line GSL, and the GIDL ground select line GIDL_GSL to which the second delayed floating voltage DF2 is applied. To decrease and/or prevent block-based erasing, a floating voltage FL that starts to rise according to and/or based on the level of the erase voltage ERS from the time point when the voltage level of the first bit line BL1 rises may be applied to the common source line CSL. In this case, the floating voltage FL may be determined according to and/or based on a capacitance distribution between the GIDL ground select line GIDL_GSL and a channel voltage, but the example embodiments are not limited thereto.

During the string-based erase operation, the ground voltage GND may be applied to the first to third word lines WL1 to WL3.

In this manner, the erase manager 112 may control an erase operation in units of strings (e.g., string-based units) for memory cells of a memory block.

Figure 7A:
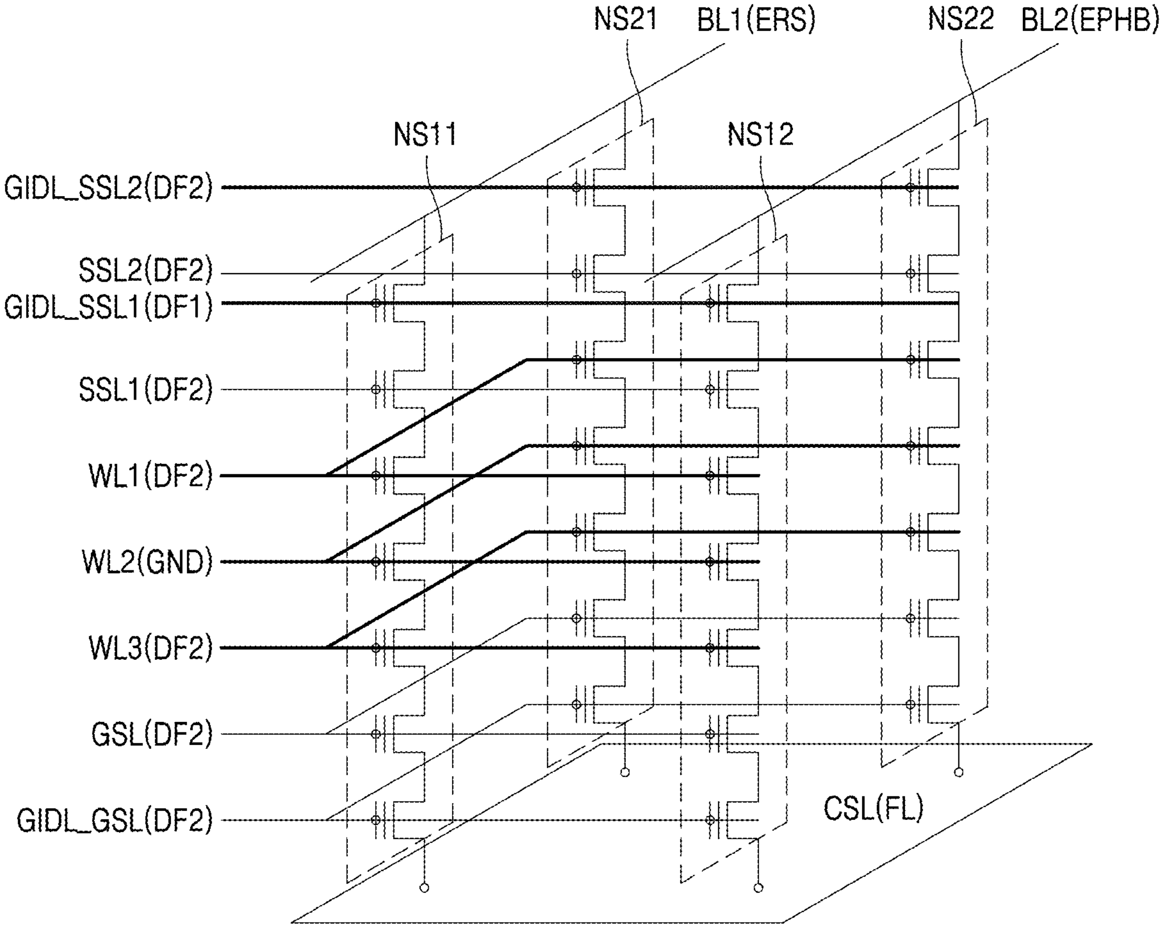
FIGS. 7A and 7B are views illustrating bias voltage conditions for an erase operation according to at least one example embodiment.
Figure 7B:
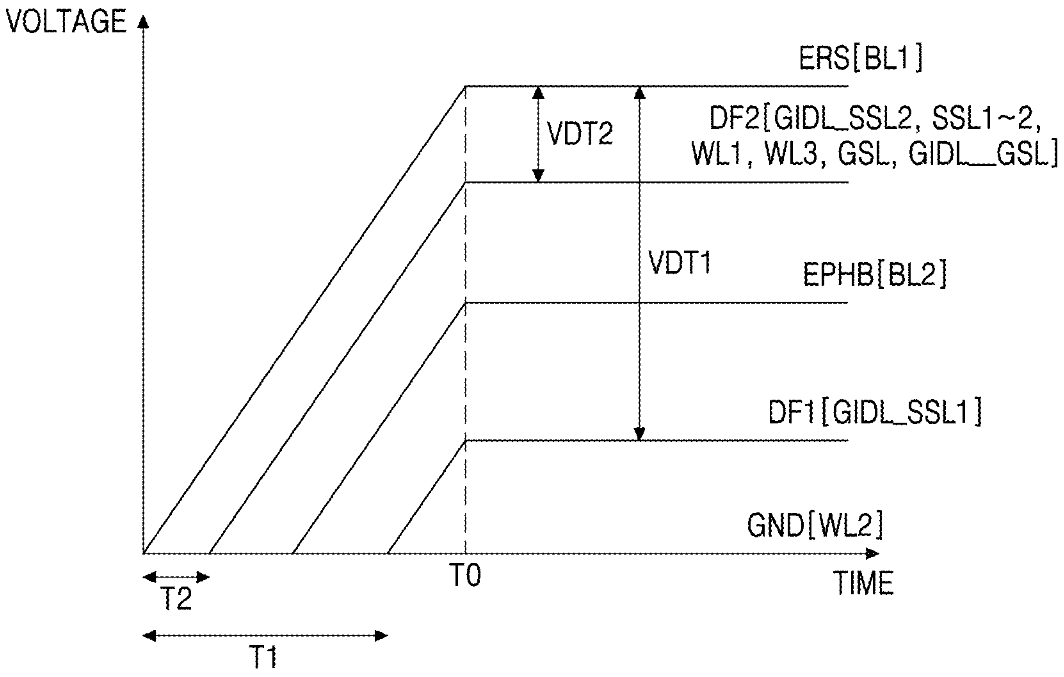

FIGS. 7A and 7B are views illustrating bias voltage conditions for an erase operation according to at least one example embodiment. FIGS. 7A and 7B may be described with reference to FIG. 1, but the example embodiments are not limited thereto.

In the following descriptions of FIGS. 7A and 7B, discussion of features described in connection to FIGS. 5A and 5B have been omitted.

FIG. 7A is a view illustrating bias voltage conditions for cell strings during a cell-based erase operation, and FIG. 7B is a view illustrating bias voltage levels shown in FIG. 7A with respect to time, but the example embodiments are not limited thereto.

According to at least one example embodiment, a first delayed floating voltage DF1 may be applied to the first GIDL string select line GIDL_SSL1 connected to the cell string NS11, etc. In addition, a second delayed floating voltage DF2 may be applied to the second GIDL string select line GIDL_SSL2 connected to the cell string NS21, etc.

Once the first GIDL string select transistor connected to the first bit line BL1 and the first GIDL string select line GIDL_SSL1 is turned on, a current sufficient for an erase operation may flow through the cell string NS11 including the first GIDL string select transistor. For example, among the memory cells of the cell string NS11, a memory cell connected to the word lines WL2 to which the ground voltage GND is applied may generate a strong electric field because of a voltage difference between a channel and the word lines WL2. Due to the strong electric field, electrons stored in the memory cell connected to the word lines WL2 to which the ground voltage GND is applied may be tunneled into the channel, and thus the data stored in the memory cell connected to the word lines WL2 to which the ground voltage GND is applied may be erased.

However, among the memory cells of the cell string NS11, data stored in memory cells connected to the word lines WL1 and WL3 to which the second delayed floating voltage DF2 is applied may not be erased (e.g., may be saved, preserved, etc.) because of a small voltage difference between the channel and the word lines WL1 and WL3.

Although the second GIDL string select transistor connected to the first bit line BL1 and the second GIDL string select line GIDL_SSL2 may be turned on, a current sufficient for an erase operation may not flow through the cell string NS21 including the second GIDL string select transistor, etc. Therefore, data stored in the memory cells of the cell string NS21 may not be erased, may be preserved, may be saved, etc.

In the case of the second bit line BL2 to which an erase prohibition voltage EPHB is applied, the channels of the cell strings NS12 and NS22 connected to the second bit line BL2 to which an erase prohibition voltage EPHB is applied may have a relatively low voltage level compared with the case of the first bit line BL1 to which an erase voltage ERS is applied, and thus data stored in the memory cells connected to the word lines WL2 to which the ground voltage GND is applied may not be erased (e.g., may be preserved, may be saved, etc.) because of a small voltage difference between the channels and the word lines WL2, etc. A floating voltage FL that starts to rise according to and/or based on the level of the erase voltage ERS from the time point when the voltage level of the first bit line BL1 rises may be applied to the common source line CSL. In this case, the floating voltage FL may be determined according to and/or based on a capacitance distribution between the GIDL ground select line GIDL_GSL and a channel voltage, etc.

During the cell-based erase operation, the ground voltage GND may be applied to the word lines WL2, and the second delayed floating voltage DF2 may be applied to the word lines WL1 and WL3. However, this is merely an example, and the ground voltage GND may be applied to any word lines among the word lines WL1 to WL3 during the cell-based erase operation, etc.

In this manner, the erase manager 112 may control an erase operation in units of cells (e.g., cell-based units, etc.) for memory cells of a memory block.

Figure 8A:
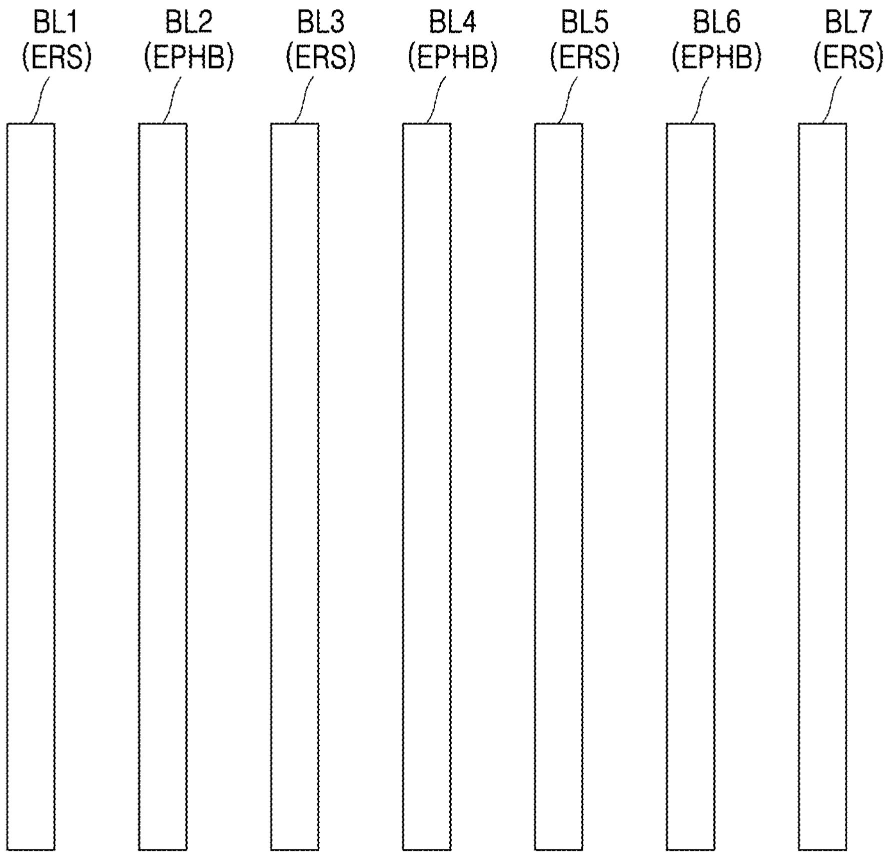
FIGS. 8A and 8B are views illustrating bias voltage conditions for bit lines according to embodiment.
Figure 8B:
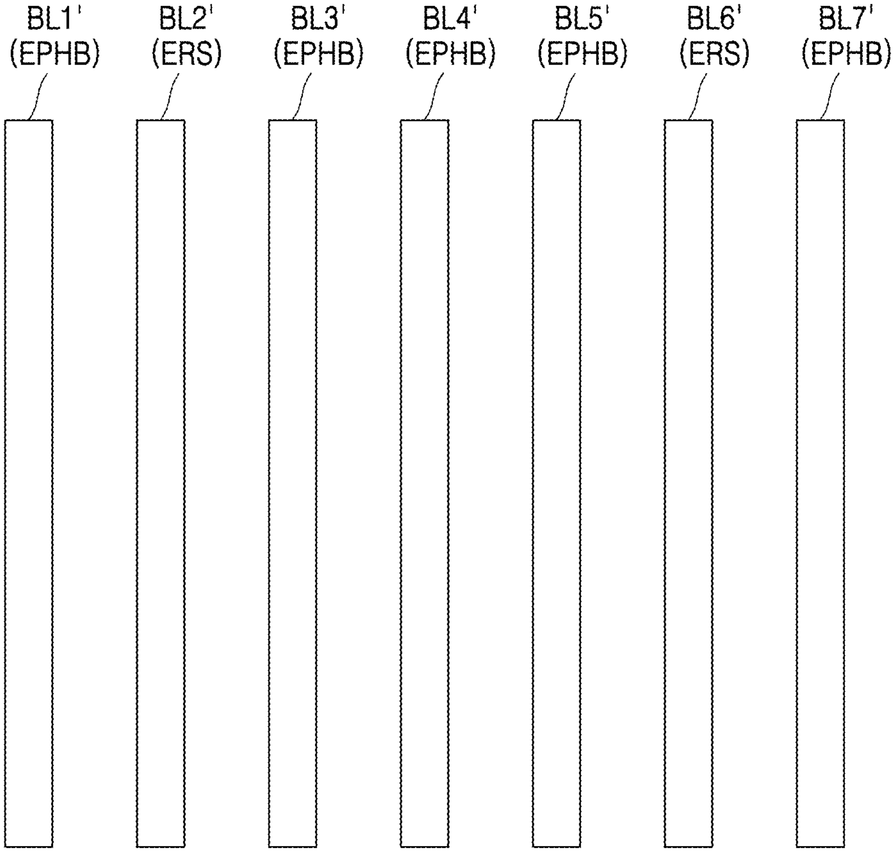

FIGS. 8A and 8B are views illustrating bias voltage conditions for bit lines according to some example embodiments. FIGS. 8A and 8B may be described with reference to FIG. 1, but the example embodiments are not limited thereto.

FIG. 8A illustrates an example in which data stored in first cell strings connected to a plurality of bit lines are erased, e.g., odd-numbered bit lines BL1, BL3, BL5, and/or BL7, etc., and data stored in second cell strings connected to a plurality of bit lines, e.g., even-numbered bit lines BL2, BL4, and/or BL6, etc., are preserved, saved, and/or prevented from being erased, etc. However, this is merely an example and the example embodiments are not limited thereto. For example, the data stored in the second cell strings connected to the even-numbered bit lines BL2, BL4, and BL6 are erased, and the data stored in the first cell strings connected to the odd-numbered bit lines BL1, BL3, BL5, and BL7 are prevented from being erased, may also be described with reference to FIG. 8A except that the data stored in the second cell strings connected to the even-numbered bit lines BL2, BL4, and BL6 are to be erased, and the data stored in the first cell strings connected to the odd-numbered bit lines BL1, BL3, BL5, and BL7 are to be preserved, saved, and/or prevented from being erased, etc.

The erase manager 112 may control a bit-line-based erase operation such that the data stored in the first cell strings connected to the odd-numbered bit lines BL1, BL3, BL5, and BL7 may be simultaneously erased, and the data stored in the second cell strings connected to the even-numbered bit lines BL2, BL4, and BL6 may be preserved, saved, and/or prevented from being erased, etc., but the example embodiments are not limited thereto.

FIG. 8B illustrates an example in which non-adjacent arbitrary bit lines are simultaneously erased according to at least one example embodiment.

Referring to FIG. 8B, an erase voltage ERS may be applied to a second bit line BL2' and a sixth bit line BL6' which is not adjacent to the second bit line BL2' but is adjacent to fifth and seventh bit lines BL5' and BL7' to which an erase prohibition voltage EPHB is applied. Under the control of the erase manager 112, data stored in the cell strings connected to the second bit line BL2' and the seventh bit line BL7' that are not adjacent to each other may be simultaneously erased, but the example embodiments are not limited thereto. In addition, under the control of the erase manager 112, data stored in the cell strings connected to a first bit line BL1', a third bit line BL3', a fourth bit line BL4', the fifth bit line BL5', and the seventh bit line BLL7' to which the erase prohibition voltage EPHB is applied may be saved, preserved, and/or prevented from being erased.

Figure 9:
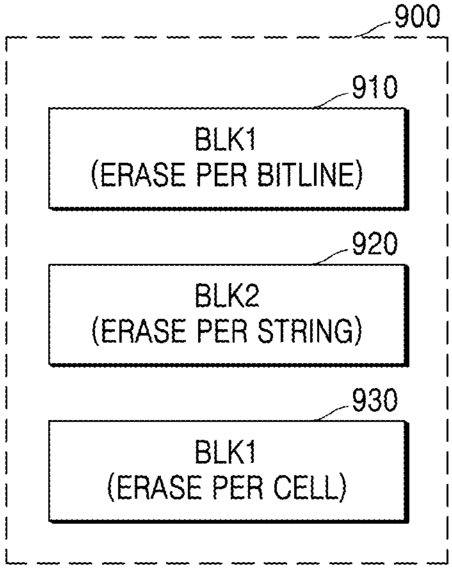
FIG. 9 is a view illustrating memory blocks according to at least one example embodiment.

FIG. 9 is a view illustrating a plurality of memory blocks 900 according to at least one example embodiment. FIG. 9 may be described with reference to FIG. 1, but the example embodiments are not limited thereto.

The erase manager 112 may control at least one of a bit-line-based erase operation, a string-based erase operation, and/or a cell-based erase operation for each of the memory blocks 900, but the example embodiments are not limited thereto, and for example, may further include a block-based erase operation, a page-based erase operation, etc.

The memory blocks 900 may include a plurality of memory blocks, such as a first memory block 910, a second memory block 920, and/or a third memory block 930, etc., but is not limited thereto.

For example, the erase manager 112 may control a bit-line-based erase operation for the first memory block 910, a string-based erase operation for the second memory block 920, and/or a cell-based erase operation for the third memory block 930, but the example embodiments are not limited thereto. However, this is merely an example, and the erase manager 112 may independently control erase units of one or more of the plurality of memory blocks, e.g., the first to third memory blocks 910 to 930, etc. Erase units of the memory blocks 900 may be determined based on a desired time period and/or desired power desired and/or necessary for erasing the memory blocks 900 and the dispersion of memory cells of the memory blocks 900, etc.

Figure 10:
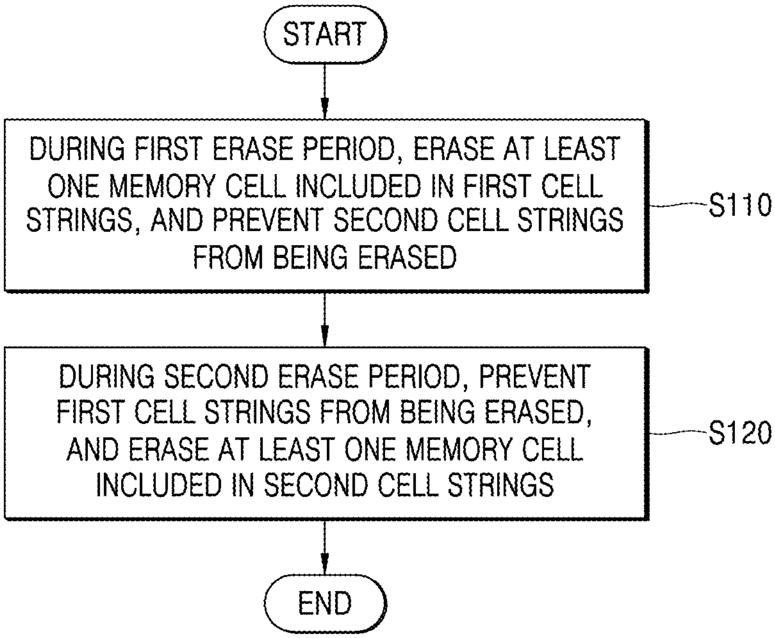
FIG. 10 is a view illustrating an operating method of a storage device according to at least one example embodiment.

FIG. 10 is a view illustrating an operating method of a storage device according to at least one example embodiment. FIG. 10 may be described with reference to FIG. 1, but the example embodiments are not limited thereto.

In operation S110, during a first erase period, the erase manager 112 may erase data stored in at least one memory cell included in first cell strings connected to odd-numbered bit lines, and may preserve data stored in second cell strings connected to even-numbered bit lines, e.g., prevent second cell strings connected to even-numbered bit lines from being erased, etc.

In operation S120, during a second erase period, the erase manager 112 may preserve data stored in the first cell strings, e.g., prevent the first cell strings from being erased, and may erase data stored in at least one memory cell included in the second cell strings.

Figure 11:
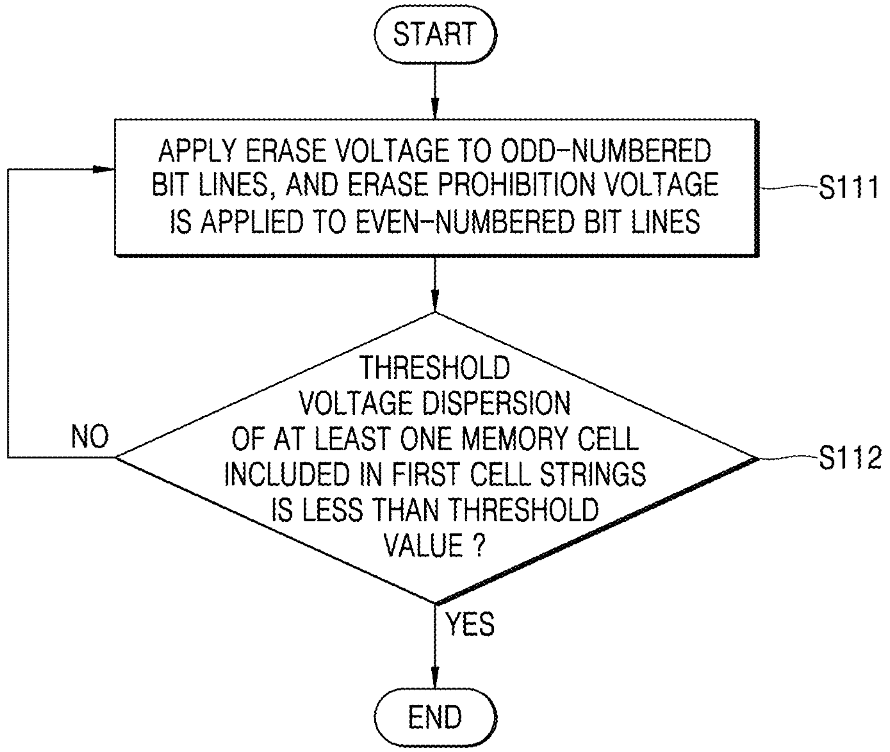
FIG. 11 is a view illustrating an operating method of a storage device according to at least one example embodiment.

FIG. 11 is a view illustrating an operating method of a storage device according to at least one example embodiment. FIG. 11 may be described with reference to FIGS. 1, 8A, and 10.

FIG. 11 illustrates an example of operation S110 shown in FIG. 10, but the example embodiments are not limited thereto. In addition, operation S120 shown in FIG. 10 may also be described with reference to FIG. 10 except that the second cell strings connected to the even-numbered bit lines are to be erased, and the first cell strings connected to the odd-numbered bit lines are to be preserved, e.g., prevented from being erased, etc.

In operation S111, the erase manager 112 may apply an erase voltage ERS to the odd-numbered bit lines and an erase prohibition voltage EPHB to the even-numbered bit lines, but is not limited thereto.

In operation S112, the erase manager 112 may determine whether a threshold voltage dispersion of at least one memory cell included in the first cell strings is less than a threshold value (e.g., desired threshold voltage value, etc.). In response to the erase manager 112 determining that the threshold voltage dispersion of at least one memory cell included in the first cell strings is less than the threshold value, the erase manager 112 may terminate operation S110, and conversely, in response to the erase manager 112 determining that the threshold voltage dispersion is greater than or equal to the threshold value, the erase manager 112 may perform operation S111.

Through operations S111 and S112, the erase manager 112 may control a repetitive (e.g., repeated, looped, etc.) erase operation, such that the threshold voltage dispersion of at least one memory cell included in the first cell strings may be less than the threshold value.

Figure 12:
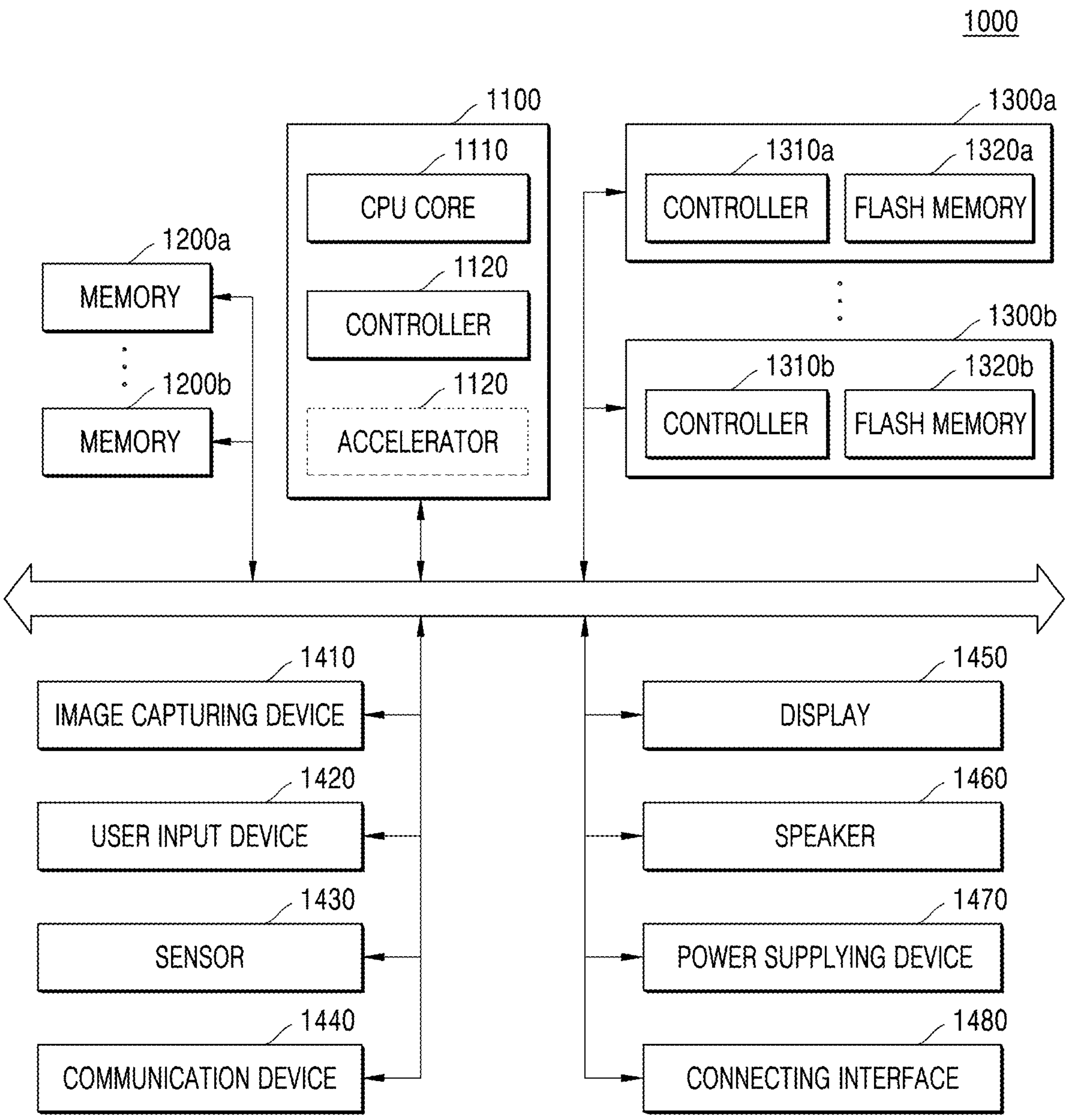
FIG. 12 is a view illustrating an electronic system to which storage devices are applied, according to at least one example embodiment.

FIG. 12 is a view illustrating a system 1000 to which storage devices 1300*a* and 1300*b* are applied, according to at least one example embodiment.

The system 1000 shown in FIG. 12 may be a mobile system such as a mobile phone, a smartphone, a tablet, a laptop, a wearable device, a smart device, a healthcare device, a robotic device, a drone, an automotive device, and/or an Internet-of-things (IoT) device, etc., but is not limited thereto. Additionally, the system 1000 shown in FIG. 12 is not limited to the mobile system, and may be a personal computer (PC), a server, a media player, a gaming console, and/or a navigation system, etc.

Referring to FIG. 12, the system 1000 may include at least one main processor 1100, one or more memories, e.g., memories 1200*a* and 1200*b*, etc., and/or one or more storage devices, e.g., storage devices 1300*a* and 1300*b*, etc., but is not limited thereto, and may for example, include a greater or lesser number of constituent components, etc. In addition, the system 1000 may further include at least one selected from an image capturing device 1410, a user input device 1420, a sensor 1430, a communication device 1440, a display 1450, a speaker 1460, a power supplying device 1470, and/or a connecting interface 1480, etc., but the example embodiments are not limited thereto.

The main processor 1100 may control overall operations of the system 1000. For example, the main processor 1100 may control operations of components of the system 1000, etc. The main processor 1100 may be implemented as a general-purpose processor, a dedicated processor, an application processor, or the like. According to at least one example embodiment, the main processor 1100 may be implemented as processing circuitry and the processing circuitry may include hardware including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto.

The main processor 1100 may include at least one CPU core 1110. The main processor 1100 may further include at least one controller 1120 configured to control the memories 1200*a* and 1200*b* and/or the storage devices 1300*a* and 1300*b*, but is not limited thereto. In some example embodiments, the main processor 1100 may further include at least one accelerator 1130 as a dedicated circuit for high-speed data operation, such as an artificial intelligence (AI) data operation, etc. The accelerator 1130 may include a graphics processing unit (GPU), a neural processing unit (NPU), a data processing unit (DPU), and/or the like. The accelerator 1130 may be implemented as processing circuitry and/or a semiconductor chip that is physically independent from the other components of the main processor 1100, but is not limited thereto.

The memories 1200*a* and 1200*b* may be used as main memory devices of the system 1000, etc. The memories 1200*a* and 1200*b* may include volatile memory devices such as SRAM, and/or DRAM, etc., and/or may include NVM devices such as flash memory, PRAM, and/or RRAM, etc. The memories 1200*a* and 1200*b* may be provided in a package in which the main processor 1100 is provided, but are not limited thereto.

The storage devices 1300*a* and 1300*b* may function as nonvolatile storage devices capable of retaining data without the supply of power, and may have a relatively large storage capacity than the memories 1200*a* and 1200*b*, but is not limited thereto. The storage devices 1300*a* and 1300*b* may include storage controllers 1310*a* and 1310*b*, and NVMs 1320*a* and 1320*b* that store data under control by the storage controllers 1310*a* and 1310*b*, but the example embodiments are not limited thereto. The NVMs 1320*a* and 1320*b* may include 2D and/or 3D VNAND flash memories, and/or may include other types of NVMs such as PRAM and/or RRAM, etc., but the example embodiments are not limited thereto.

The storage devices 1300*a* and 1300*b* may be included in the system 1000 in a state in which the storage devices 1300*a* and 1300*b* are physically separate from the main processor 1100 and/or are provided in the same package as the main processor 1100. In addition, the storage devices 1300*a* and 1300*b* may be provided in the form of solid state drives (SSDs) and/or memory cards attachable to other components of the system 1000 through interfaces, such as the connecting interface 1480 (described below), but the example embodiments are not limited thereto. The storage devices 1300*a* and 1300*b* may comply with standard protocols, such as the UFS, eMMC, and/or NVMe protocol, but are not limited thereto.

The image capturing device 1410 may capture a still image and/or a moving video, and examples of the image capturing device 1410 may include a camera, a camcorder, a webcam, and/or the like. The user input device 1420 may receive various types of data input from a user of the system 1000, and examples of the user input device 1420 may include a touch pad, a keypad, a keyboard, a mouse, a microphone, and/or the like. The sensor 1430 may detect various types of physical quantities that may be obtained from an external source to the system 1000 and may convert the detected physical quantities into electrical signals. Examples of the sensor 1430 may include a temperature sensor, a pressure sensor, an illuminance sensor, a position sensor, an acceleration sensor, a biosensor, a gyroscope sensor, and/or the like.

The communication device 1440 may exchange one or more signals with other devices provided outside the system 1000 according to various communication protocols. The communication device 1440 may include an antenna, a transceiver, a modem, and/or the like. The display 1450 and the speaker 1460 may function as output devices configured to output visual information and/or audio information, etc., to a user of the system 1000. The power supplying device 1470 may appropriately convert power supplied from a battery (not shown) included in the system 1000 and/or an external power supply, and may supply the converted power to each component of the system 1000.

The connecting interface 1480 may connect the system 1000 to at least one external device that is capable of exchanging data with the system 1000 when connected to the system 1000, but is not limited thereto.

The connecting interface 1480 may be implemented according to various interface methods, such as advanced technology attachment (ATA), serial ATA (SATA), external SATA (e-SATA), small-computer small-interface (SCSI), serial attached SCSI (SAS), peripheral component interconnection (PCI), PCI express (PCIe), NVMe, IEEE 1394, universal serial bus (USB), secure digital (SD) cards, multimedia card (MMC), eMMC, UFS, embedded UFS (eUFS), and/or compact flash (CF) card interface, etc.

While various example embodiments of the inventive concepts have been particularly shown and described, it will be understood that various changes in form and details may be made therein without departing from the spirit and scope of the following claims.

What is claimed is:

1. A storage device comprising:

a three-dimensional (3D) nonvolatile memory comprising a plurality of memory blocks, each of the plurality of memory blocks including a plurality of cell strings connected to a common source line and a plurality of bit lines; and processing circuitry configured to, apply an erase voltage to a first bit line of the plurality of bit lines of at least one memory block of the plurality of memory blocks, apply an erase prohibition voltage to a second bit line of the plurality of bit lines, the erase prohibition voltage having a voltage level lower than a voltage level of the erase voltage, and float the common source line using a common source line floating voltage, the floating the common source line causing an erasure of data stored in at least one first memory cell included in at least one first cell string connected to the first bit line by floating the common source line, and preservation of data stored in at least one second memory cell included in at least one second cell string connected to the second bit line, the common source line floating voltage having a voltage level based on a capacitance distribution of a gate induced drain leakage (GIDL) ground select line and a channel voltage.

2. The storage device of claim 1, wherein each of the plurality of memory blocks is connected to a plurality of GIDL string select lines; and the processing circuitry is further configured to, float a first GIDL string select line of the plurality of GIDL string select lines after applying a ground voltage to the first GIDL string select line for a first desired time period, the floating the first GIDL string select line causing the erasure of data stored in the at least one first memory cell, and float a second GIDL string select line of the plurality of GIDL string select lines after applying the ground voltage to the second GIDL string select line for a second desired time period shorter than the first desired time period.

3. The storage device of claim 2, wherein, each of the plurality of memory blocks further includes:

a plurality of pads connected to the plurality of bit lines, the plurality of pads overlapping a plurality of GIDL string select transistors connected to the first GIDL string select line or the second GIDL string select line in a first direction perpendicular to the plurality of bit lines.

4. The storage device of claim 2, wherein the processing circuitry is further configured to:

adjust a first detection voltage to be greater than a second detection voltage, the first detection voltage being a voltage applied between the first bit line and the first GIDL string select line, and the second detection voltage being a voltage applied voltage between the first bit line and the second GIDL string select line.

5. The storage device of claim 2, wherein the processing circuitry is further configured to:

adjust current flowing through a first channel of the at least one first cell string to be less than current flowing through a second channel of the at least one first cell string, the first channel connected to the first bit line and the second GIDL string select line, and the second channel connected to the first bit line and the first GIDL string select line.

6. The storage device of claim 2, wherein
the at least one first cell string is connected to a plurality of word lines, the plurality of word lines including a first word line and a second word line; and
the processing circuitry is further configured to,
erase the data stored in the at least one first memory cell included in the at least one first cell string and connected to the first word line, the erasing including applying the ground voltage to the first word line, applying the ground voltage to the second word line for the second desired time period, and floating the second word line.

7. The storage device of claim 6, wherein the processing circuitry is further configured to:
perform at least one of a bit-line-based erase operation, a string-based erase operation, and a cell-based erase operation on the at least one memory block of the plurality of memory blocks.

8. The storage device of claim 1, wherein the processing circuitry is further configured to:
erase data stored in at least one memory cell included in at least one third cell string included in the plurality of cell strings, the at least one third cell string connected to a third bit line, the third bit line being adjacent to the second bit line and not adjacent to the first bit line.

9. The storage device of claim 1, wherein the processing circuitry is further configured to:
perform a repetitive erase operation such that a threshold voltage dispersion of the at least one first memory cell included in the at least one first cell string is less than a desired threshold value.

10. A storage device comprising:
a three-dimensional (3D) nonvolatile memory comprising a plurality of memory blocks, each memory block of the plurality of memory blocks comprising a plurality of cell strings connected to a common source line and a plurality of bit lines; and
processing circuitry configured to,
erase data stored in at least one memory cell included in at least one first cell string connected to odd-numbered bit lines of the plurality of bit lines by applying an erase voltage to the odd-numbered bit lines and floating the common source line using a common source line floating voltage, and preserve data stored in at least one memory cell included in at least one second cell string connected to even-numbered bit lines of the plurality of bit lines during a first erase period by applying an erase prohibition voltage to the even-numbered bit lines, the erase prohibition voltage having a voltage level lower than a voltage level of the erase voltage while the common source line is floated, the common source line floating voltage having a voltage level based on a capacitance distribution of a gate induced drain leakage (GIDL) ground select line and a channel voltage, and
preserve data stored in the at least one memory cell included in the at least one first cell string by applying the erase prohibition voltage to the odd-numbered bit lines and floating the common source line using the common source line floating voltage, and erase data stored in the at least one memory cell included in the at least one second cell string by applying the erase voltage to the even-numbered bit lines while the common source line is floated.

11. The storage device of claim 10, wherein the processing circuitry is further configured to:
perform at least one of a bit-line-based erase operation, a string-based erase operation, and a cell-based erase operation, for at least one memory block of the plurality of memory blocks.

12. The storage device of claim 10, wherein the processing circuitry is further configured to:
perform a repetitive erase operation such that a threshold voltage dispersion of the at least one memory cell included in the at least one first cell string is less than a desired threshold value.

13. A storage system comprising:
a storage device comprising a plurality of memory blocks, each of the plurality of memory blocks comprising a plurality of cell strings connected to a common source line and a plurality of bit lines;
a host device configured to transfer an erase command to the storage device; and
the storage device is configured to, in response to the erase command,
apply an erase voltage to a first bit line of the plurality of bit lines,
apply an erase prohibition voltage to a second bit line, the erase prohibition voltage having a voltage level lower than a voltage level of the erase voltage, and
float the common source line using a common source line floating voltage, the floating including erasing data stored in at least one memory cell included in at least one first cell string of the plurality of cell strings, and preserving data stored in at least one memory cell included in at least one second cell string of the plurality of cell strings, the at least one first cell string connected to the first bit line and the at least one second cell string connected to the second bit line, the common source line floating voltage having a voltage level based on a capacitance distribution of a gate induced drain leakage (GIDL) ground select line and a channel voltage.

14. The storage system of claim 13, wherein
each of the plurality of memory blocks is connected to a plurality of GIDL string select lines; and
the storage device is further configured to,
float a first GIDL string select line of the plurality of GIDL string select lines after applying a ground voltage to the first GIDL string select line for a first desired time period, the floating the first GIDL string select line causing the erasure of data stored in the at least one memory cell included in the at least one first cell string, and
float a second GIDL string select line of the plurality of GIDL string select lines after applying the ground voltage to the second GIDL string select line for a second desired time period shorter than the first desired time period.

15. The storage system of claim 14, wherein, each of the plurality of memory blocks further includes:
a plurality of pads connected to the plurality of bit lines, the plurality of pads overlapping a plurality of GIDL string select transistors connected to the first GIDL string select line or the second GIDL string select line in a first direction perpendicular to the plurality of bit lines.

16. The storage system of claim 14, wherein the storage device is further configured to:

adjust a first detection voltage to be greater than a second detection voltage, is the first detection voltage being a voltage applied between the first bit line and the first GIDL string select line, and the second detection voltage being a voltage applied between the first bit line and the second GIDL string select line.

17. The storage system of claim 14, wherein the storage device is further configured to:

adjust current flowing through a first channel of the at least one first cell string to be less than current flowing through a second channel of the at least one first cell string, the first channel connected to the first bit line and the second GIDL string select line, and the second channel connected to the first bit line and the first GIDL string select line.

18. The storage system of claim 14, wherein the at least one first cell string is connected to a plurality of word lines, the plurality of word lines including a first word line and a second word line; and the storage device is further configured to erase the data stored in the at least one memory cell included in the at least one first cell string and connected to the first word line, the erasing including applying the ground voltage to the first word line, applying the ground voltage to the second word line for the second desired time period, and floating the second word line.

19. The storage system of claim 18, wherein the storage device is further configured to perform, for at least one memory block of the plurality of memory blocks, at least one of a bit-line-based erase operation, a string-based erase operation, and a cell-based erase operation.

20. The storage system of claim 13, wherein the storage device is further configured to perform a repetitive erase operation such that a threshold voltage dispersion of the at least one memory cell included in the at least one first cell string is less than a desired threshold value.

* * * * *